United States Patent
Chun

(10) Patent No.: US 9,552,163 B1
(45) Date of Patent: Jan. 24, 2017

(54) SYSTEMS AND METHODS FOR PROVIDING NON-POWER-OF-TWO FLASH CELL MAPPING

(71) Applicant: QUALCOMM INCORPORATED, San Diego, CA (US)

(72) Inventor: Dexter Tamio Chun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/791,340

(22) Filed: Jul. 3, 2015

(51) Int. Cl.
G06F 12/00 (2006.01)
G06F 3/06 (2006.01)
G11C 11/56 (2006.01)

(52) U.S. Cl.
CPC ........... *G06F 3/0608* (2013.01); *G06F 3/0661* (2013.01); *G06F 3/0679* (2013.01); *G11C 11/5642* (2013.01)

(58) Field of Classification Search
CPC .. G06F 3/0608; G06F 3/0661; G11C 11/5642; G11C 3/0679
See application file for complete search history.

(56) References Cited

U.S. PATENT DOCUMENTS

| | | | |
|---|---|---|---|
| 5,668,756 A | 9/1997 | Tomioka | |
| 6,279,133 B1 | 8/2001 | Vafai et al. | |
| 8,009,471 B2 | 8/2011 | Haines et al. | |
| 8,533,405 B2 | 9/2013 | Kim et al. | |
| 8,745,317 B2 | 6/2014 | Weingarten | |
| 2007/0208905 A1 | 9/2007 | Litsyn et al. | |
| 2010/0281207 A1 | 11/2010 | Miller et al. | |
| 2011/0239088 A1 | 9/2011 | Post | |
| 2011/0264843 A1* | 10/2011 | Haines | G06F 12/0246 711/103 |
| 2013/0127512 A1 | 5/2013 | Murari | |
| 2013/0145235 A1 | 6/2013 | Alhussien et al. | |
| 2014/0189200 A1 | 7/2014 | Gavens | |
| 2014/0278446 A1 | 9/2014 | Kamano et al. | |

(Continued)

FOREIGN PATENT DOCUMENTS

EP 1035473 A1 9/2000

OTHER PUBLICATIONS

Bradley S. Tice, Proc. SPIE 6896, Integrated Optics: Devices, Materials, and Technologies XII, 68961H, "The use of a radix 5 base for transmission and storage of information," Feb. 15, 2008 vol. 6896.

(Continued)

*Primary Examiner* — John A Lane
(74) *Attorney, Agent, or Firm* — Smith Tempel

(57) ABSTRACT

Systems, methods, and computer programs are disclosed for providing compressed data storage using non-power-of-two flash cell mapping. One embodiment of a method comprises receiving one or more compressed logical pages to be stored in a NAND flash memory. Binary data in the one or more logical pages is transformed to a quinary representation. The quinary representation comprises a plurality of quinary bits. A binary representation of each of the plurality of quinary bits is transmitted to the NAND flash memory. The binary representation of each of the plurality of quinary bits is converted to a quinary voltage for a corresponding cell in a physical page in the NAND flash memory.

30 Claims, 13 Drawing Sheets

(56) References Cited

U.S. PATENT DOCUMENTS

2014/0281842 A1    9/2014    Wood et al.
2015/0161034 A1    6/2015    Fisher
2016/0188226 A1*  6/2016    Haines ................ G06F 12/0246
                                                          711/103

OTHER PUBLICATIONS

Stacy Smith; ARM Mali Graphics, ARM Connected Community, "ASTC does it," Oct. 22, 2013. http://community.arm.com/groups/arm-mali-graphics/blog/2013/10/22.
International Search Report and Written Opinion—PCT/US2016/035656—ISA/EPO—Aug. 22, 2016.

* cited by examiner

SYSTEMS AND METHODS FOR PROVIDING NON-POWER-OF-TWO FLASH CELL MAPPING

DESCRIPTION OF THE RELATED ART

Non-volatile storage, such as flash storage, is incorporated in various types of computing devices, including portable communication devices (e.g., cellular telephones, smart phones, tablet computers, portable digital assistants (PDAs), portable game consoles, wearable devices, and other battery-powered devices). Flash memory, such as NAND flash, may comprise multi-level cell (MLC) storage comprising memory elements capable of storing more than a single bit of information. For example, MLC NAND flash is a flash memory technology using multiple levels per cell to allow more bits to be stored using the same number of transistors. Current MLC NAND flash typically uses two bits per cell and a paired-page scheme, which maps exactly two bits from two separate pages onto one cell transistor. In this manner, two logical pages of data may be stored in one physical page in flash memory.

When employing data compression, however, extra space is needed to store the compression metadata. Compression metadata enables the central processing unit (CPU) to efficiently retrieve information back from the flash memory. For instance, compression metadata may indicate whether a physical page has been compressed or not and, it if is compressed, may store vital information, such as, the size and index for each of the compressed pages. The compression metadata is typically stored in extra physical pages in flash memory, which disadvantageously increases latency because additional page(s) may need to be accessed during memory write and/or read operations. Furthermore, if using data compression, storing even a relatively small amount of additional metadata uses up some of the flash cells, which results in a reduction in data capacity.

Capacity may be increased by incorporating 3-bits per cell (i.e., tri-level cells), which map each bit from three pages into eight levels of one cell. However, while capacity may be increased, cell mapping involving 3 or more bits per cell can be difficult to implement because of decreasing voltage margins to represent the additional levels.

Accordingly, there is a need for improved systems and methods for mapping compressed pages into flash cells.

SUMMARY OF THE DISCLOSURE

Systems, methods, and computer programs are disclosed for providing compressed data storage using non-power-of-two flash cell mapping. One embodiment of a method comprises receiving one or more compressed logical pages to be stored in a NAND flash memory. Binary data in the one or more logical pages is transformed to a quinary representation. The quinary representation comprises a plurality of quinary bits. A binary representation of each of the plurality of quinary bits is transmitted to the NAND flash memory. The binary representation of each of the plurality of quinary bits is converted to a quinary voltage for a corresponding cell in a physical page in the NAND flash memory.

Another embodiment is a system for providing compressed data storage using non-power-of-two flash cell mapping. The system comprises a system on chip (SoC) coupled to a flash memory device. The SoC comprises a flash controller configured to receive one or more compressed logical pages to be stored in the flash memory device. The flash controller transforms binary data in the one or more logical pages to a quinary representation. The quinary representation comprises a plurality of quinary bits. The flash controller transmits a binary representation of each of the plurality of quinary bits to the NAND flash memory. The flash memory device is configured to convert the binary representation of each of the plurality of quinary bits to a quinary voltage for a corresponding cell in a physical page.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
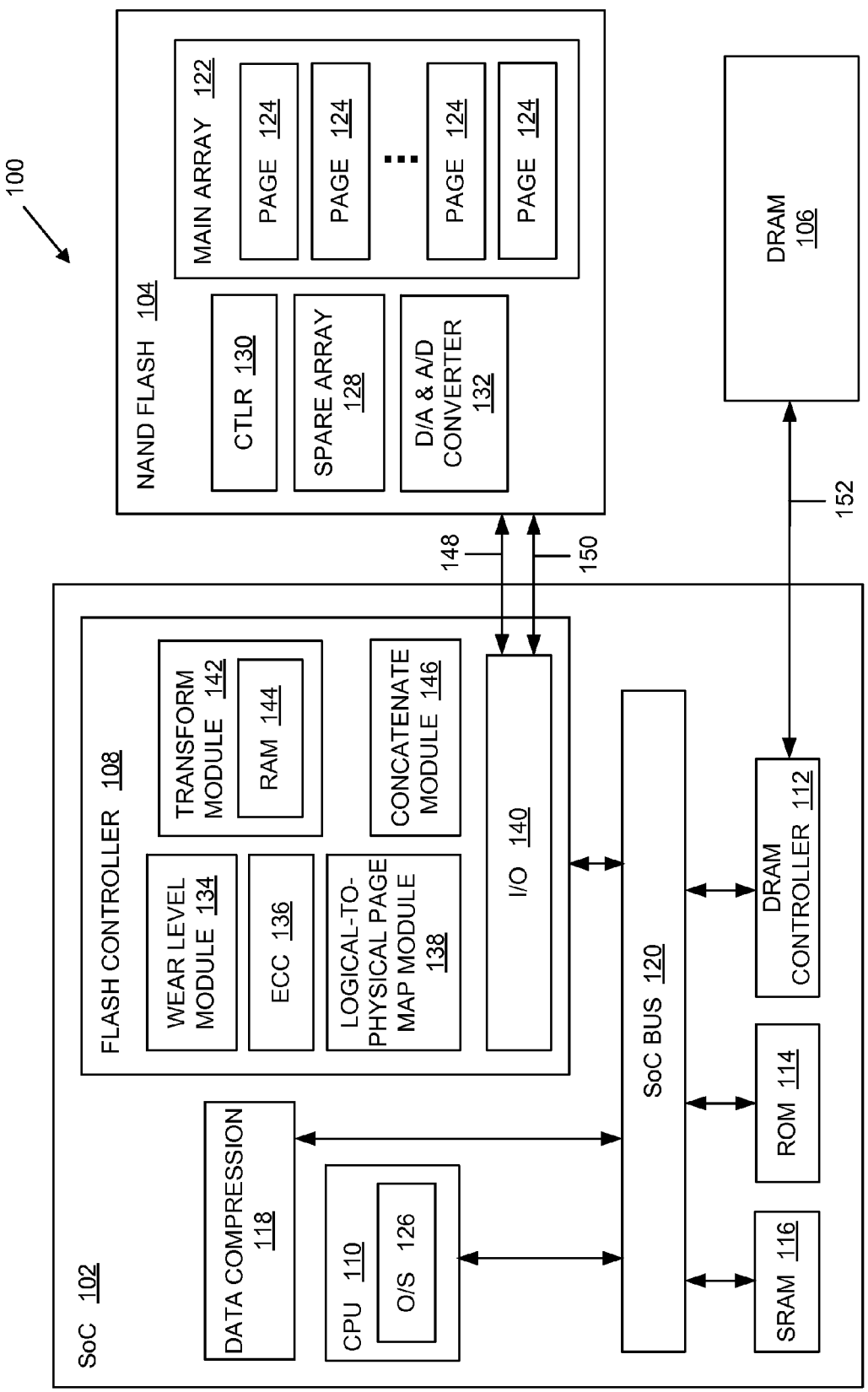
FIG. 1 is a block diagram of an embodiment of a system for providing quinary flash cell mapping.

FIG. 1 illustrates a system 100 for providing non-power-of-two MLC flash cell mapping. It should be appreciated that the term "non-power-of-two" refers to incorporating a "non-power-of-two" number of voltage levels for each flash cell (e.g., five, six, seven, nine, etc.). While the embodiments described below illustrate a "quinary" flash cell mapping scheme in which each flash cell has five levels, it should be appreciated that alternative embodiments include any "non-power-of-two" number of flash levels.

The system 100 comprises a system on chip (SoC) 102 electrically coupled to a flash memory device (e.g., NAND flash 104) and a volatile random access memory (VRAM), such as, a dynamic random access memory (DRAM) 106. The SoC 102 may be electrically coupled to the NAND flash 104 via a control bus 148 and a data bus 150. The SoC 102 may be electrically coupled to the DRAM 106 via a bus 152. The system 100 may be implemented in any computing device, including a personal computer, a workstation, a server, a portable computing device (PCD), such as a cellular telephone, a smartphone, a portable digital assistant (PDA), a portable game console, a navigation device, a tablet computer, a wearable device, such as a sports watch, a fitness tracking device, etc., or other battery-powered, web-enabled devices.

The SoC 102 comprises various on-chip components, including a central processing unit (CPU) 110 that executes an operating system (O/S) 126, a DRAM controller 112, static random access memory (SRAM) 116, read only memory (ROM) 114, a data compression component 118, and a flash controller 108 interconnected via a SoC bus 120. The SoC 102 may include one or more memory clients that request memory resources from the DRAM 106 and the NAND flash 104. The memory clients may comprise one or more processing units (e.g., central processing unit (CPU) 110, a graphics processing unit (GPU), a digital signal processor (DSP), etc.), a video encoder, or other clients requesting read/write access to the NAND flash 104 and the DRAM 106.

In the embodiment illustrated in FIG. 1, the NAND flash 104 is separate from the SoC 102, although in other embodiments the NAND flash 104 may be physically attached or stacked onto the SoC die and reside in the same physical package as the SoC die.

The NAND flash 104 comprises a controller 130 and a main array 122 for storing the physical pages 124. As described below in more detail, the CPU 110 residing on the SoC 102 reads and/or writes data in units of logical pages to the NAND flash 104 via the flash controller. The data is stored and retrieved from the physical pages 124 of the main array 122 along with error correction bit(s) generated/checked by error correcting code (ECC) module 136 (or other error detection and/or detection algorithms, as described below in connection with FIGS. 7-13). In some embodiments, the error correction bit(s) may be stored in a spare array 128.

ECC module 136 is configured to detect and/or correct multiple-bit errors during flash memory operations. For example, during a write operation to the NAND flash 104, the ECC module 136 may use the write data as input and then generate redundant parity check bits. The combined write data and parity check bits together form a unit known as a codeword and may be stored either separated (in spare array 128) or together in the main array 122. During a read operation, the ECC module 136 may use the retrieved data portion of the codeword to recompute the parity check bits and then compare these against the parity check bits portion of the codeword that was stored during the write operation. A mismatch between the read recomputed parity and the stored parity indicates a detected error. In addition, the parity check bits may be sufficient to provide multiple error correction within the codeword. In an embodiment for NAND flash memory, an error correcting block code may be employed that can correct up to 16 or more errors within a 4 KB page.

A logical-to-physical (L2P) page map module 138 performs the mapping of the logical pages to the physical pages 124. The O/S 126 is only aware of logical page addresses, and the L2P page map module 138 handles the logical-to-physical page mapping by keeping track of pages 124 in the main array 122. A wear leveling module 134 may interface with the L2P page map module 138 so that the number of program and erase cycles experienced by any page 124 is uniform across the main array 122. The flash controller 108 further comprises I/O device(s) 140 for communicating with the NAND flash 104.

Figure 2:
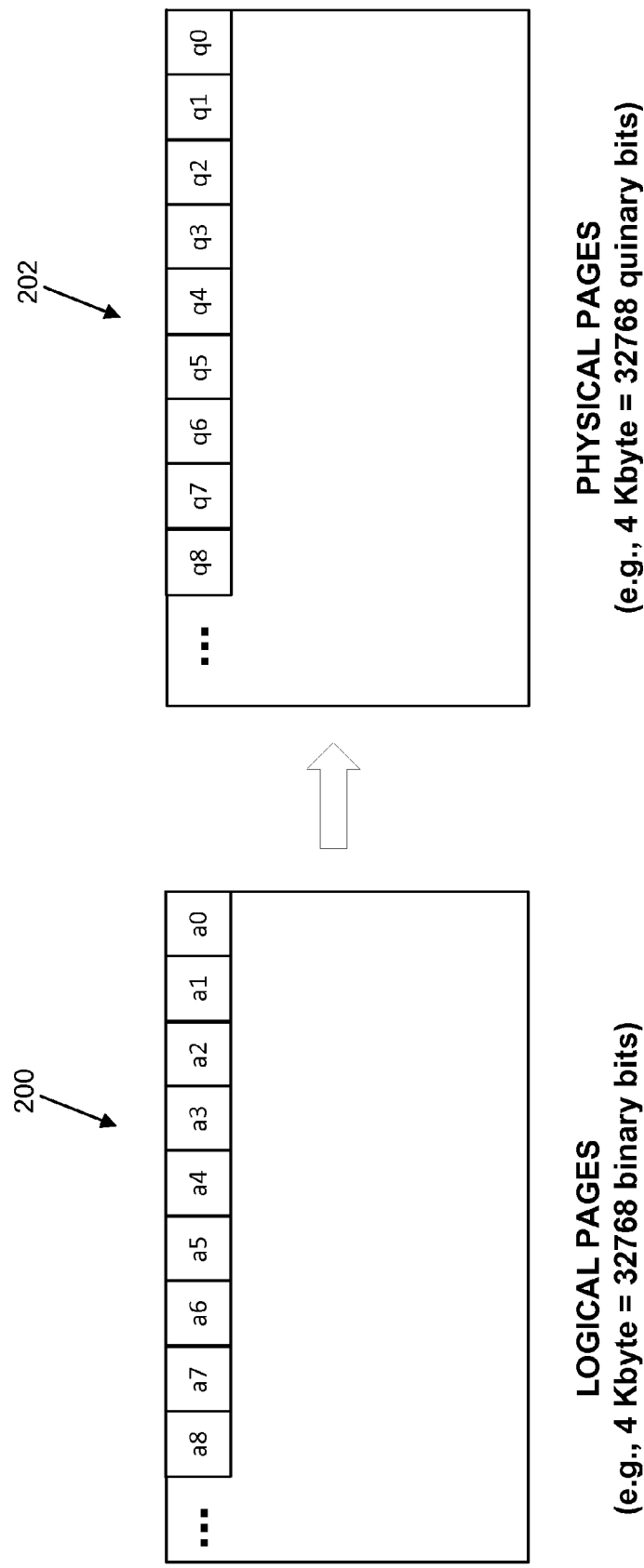
FIG. 2 illustrates an exemplary scheme for mapping logical pages to physical NAND pages in the system of FIG. 1 using a quinary representation.
Figure 3:
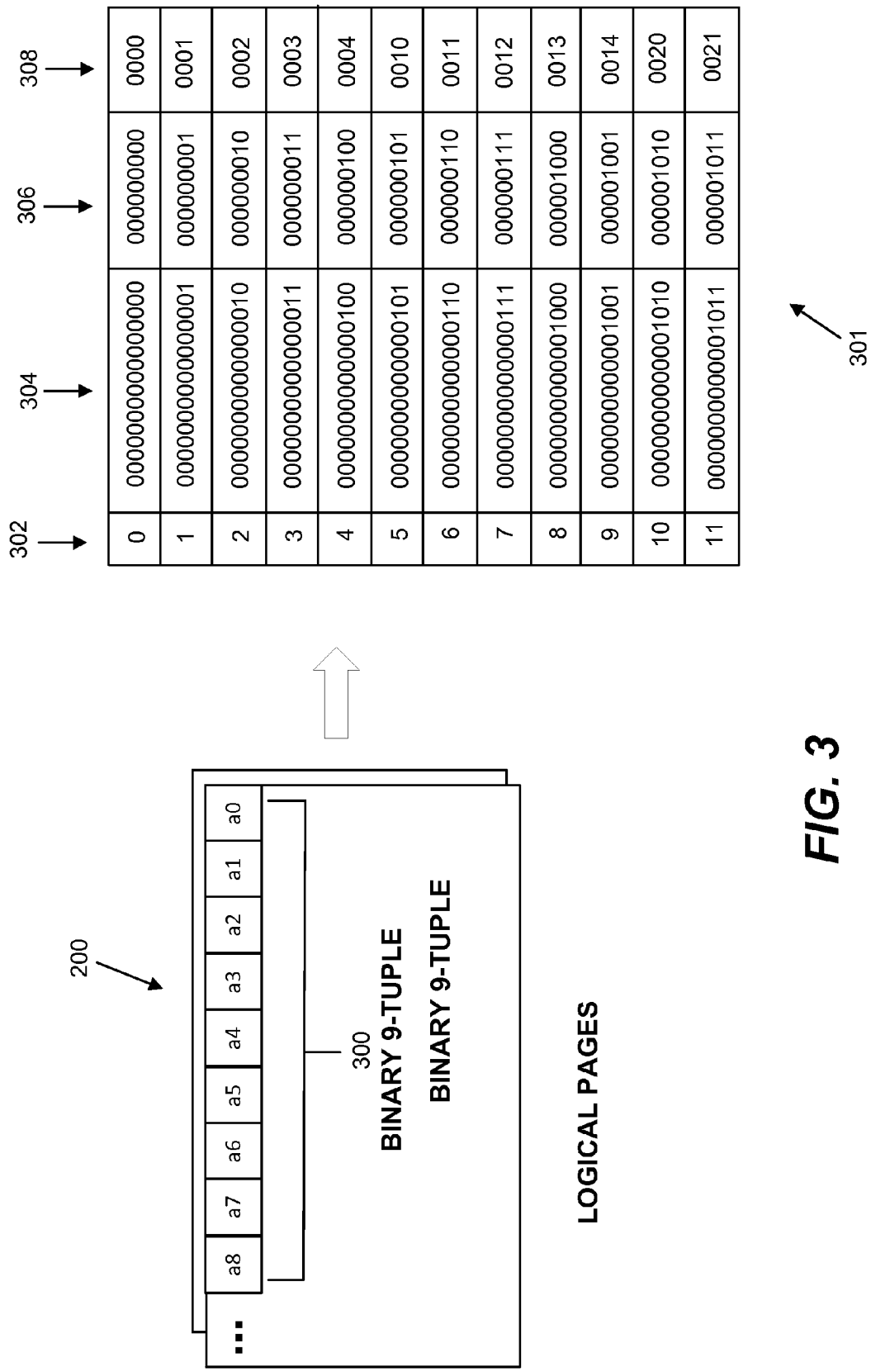
FIG. 3 illustrates an embodiment of a method for transforming binary 9-tuples in the logical pages to 4-tuples of quinary bits.
Figure 4:
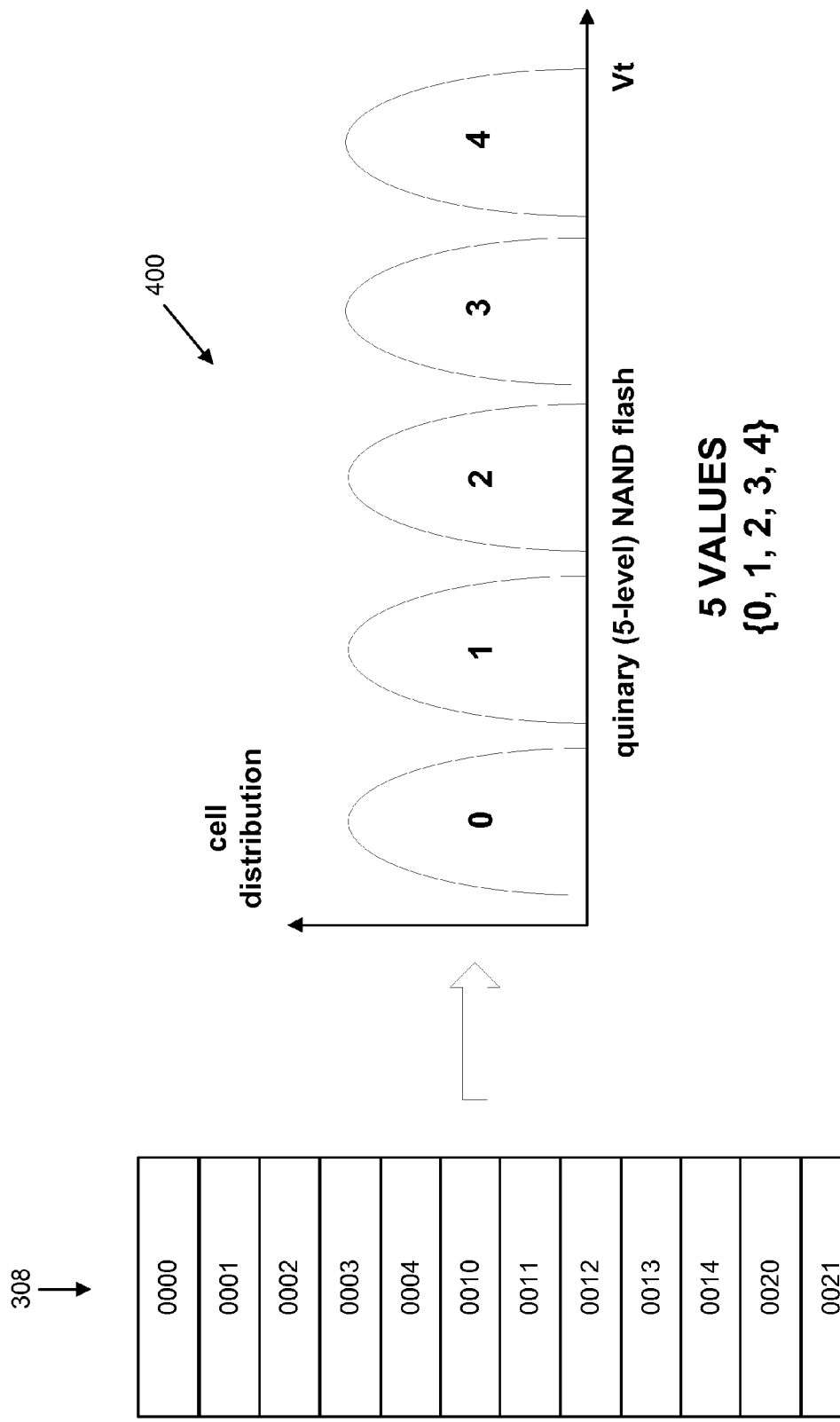
FIG. 4 illustrates quinary voltage levels for an exemplary NAND flash cell.

Referring to FIGS. 2-4, an exemplary quinary flash cell mapping scheme will be described. In general, the quinary flash cell mapping scheme incorporates five levels in each flash cell. It should be appreciated that the use of five levels may reduce the voltage noise margin compared to conventional four-level MLC implementations without the difficulties associated with eight-level (i.e., tri-level cell) implementations. As generally illustrated in FIG. 2, two or more logical pages 200 comprising binary bits (e.g., bits a0-a8, etc.) may be compressed by data compression component 118, concatenated by concatenate module 146, and transformed into a plurality of quinary bits (e.g., q0-q8, etc.) by transformation module 142.

In operation, the data compression component 118 compresses data and sends one or more compressed logical pages to the flash controller 108. The compressed logical pages may be variable in size depending on the strength of the compression algorithms and the compressibility of the data. Compression metadata may be generated from the data compression 118, the L2P page map module 138, and the concatenate module 146 and added to a header associated with each compressed page. Compression metadata may comprise, for example, the type of compression algorithm, a logical address, a physical address, a size, and a last pointer which is an index to quickly locate compressed pages within the physical page. In an exemplary embodiment, a single physical page may concatenate and fit five compressed pages. The last pointer for the first compressed page may point to the second compressed page. The last pointer for the second compressed page may point to the third compressed page, and so forth. The last pointer for the final, fifth compressed page may be null, which may be used to indicate that there are no more compressed pages. It should be appreciated that this is merely one possible implementation, and alternative embodiments may be used to rapidly seek any of the multiple compressed pages that may be packed into a single physical page. The logical address may specify an address the CPU 110 is accessing. The physical address may specify the actual location in the NAND flash 105 as determined by the L2P page map module. The size may specify the size (e.g., in bytes) of the data after compression as determined by the compression component 118. The last pointer may specify the position of the compressed page within the physical page and whether the compressed page is the last of multiple compressed pages within a current physical page as determined by the concatenate module 146.

The compression metadata may also indicate whether a logical page has been compressed. It should be appreciated that the data may comprise pre-compressed data (e.g., MOV, MP4, AVI, AAC, and JPG containers). The data compression component 118 may attempt to compress these or other types of containers but terminate early if it is determined that the logical block is incompressible. In this case, the logical page data may remain the original logical page size.

The concatenate module 146 may inspect the incoming logical page headers which include compression and size metadata, and perform a best-effort concatenation of multiple compressed logical pages. In an embodiment, the concatenation may result in no fewer than two logical pages for each physical page 124, which is equivalent to conventional MLC capacity. It should be appreciated, however, that depending on the data compression and the effectiveness of the concatenation process more than two logical pages may be mapped to a single physical page 124. During the concatenation step, the last pointer metadata may be produced by concatenate module 146 and inserted into the header for the respective logical page.

After the compression and concatenation of the logical pages, the transformation module 142 may temporarily store the pages in RAM 144, and then transform the binary bits to a quinary representation. FIG. 3 illustrates an exemplary implementation in which the transformation module 142 transforms the data in each logical page 200 from binary 9-tuples to quinary 4-tuples. A binary 9-tuple 300 may comprise binary bits a0, a1, a2, a3, a4, a5, a6, a7, and a8 in a logical page 200. Table 301 illustrates quinary representations in column 308 for binary 9-tuples 300 (column 306) having decimal values 0-11 (column 302). The corresponding 16-bit binary representations are listed in column 304. As illustrated in FIG. 4, a quinary 4-tuple comprises a nibble of four quinary bits (i.e., a qit). Each quinary bit can have one of five values {0, 1, 2, 3, 4} corresponding to a NAND flash voltage. The graph 400 in FIG. 4 illustrates the quinary (5-level) NAND flash voltages (Vt). For example, quinary 5=binary 101.

For each physical page 124 that is concatenated and transformed, the binary representation of the quinary bits are transmitted conventionally over the data bus 150. For example, quinary 5 may be transmitted using binary 101, either in parallel or serially. Within the NAND flash 104, the binary representation of each quinary bit (e.g., 101 in the case of quinary 5) is then converted to a true quinary voltage (e.g., 5V) via D/A converter 132.

When retrieving data from the NAND flash 104, the above steps may be reversed. For instance, the quinary voltage on the cell within a physical page 124 may be sensed and then converted by A/D converter 132. The 3-bit representation for each quinary bit returns over the data bus 150, where it may be reverse transformed by transformation module 142 and split by concatenate module 146.

It should be appreciated that the quinary flash cell mapping described above may significantly improve data capacity compared to existing 2-bit MLC techniques. For example, referring to FIG. 2, consider a logical page 200 comprising 4 Kbytes=32,768 bits. The system 100 may convert each binary 9-tuple 300 to a quinary 4-tuples. Because of the 9:4 ratio, only 14,563 qits are needed to store 32,768 bits. With each physical page 124 comprising 32,768 cells (i.e., a 4 Kbyte physical page), each quinary cell can theoretically store log 2(5)=2.32 bits of information (i.e., 73,725 bits of stored information). Therefore, the quinary effective gain is 73,725/32,768=2.2499, whereas a 4-level MLC gain is exactly 2.0. Therefore, the quinary flash cell mapping yields approximately 24.99% more capacity than conventional 4-level MLC without the voltage margin problems associated with existing 8-level implementations.

Figure 5:
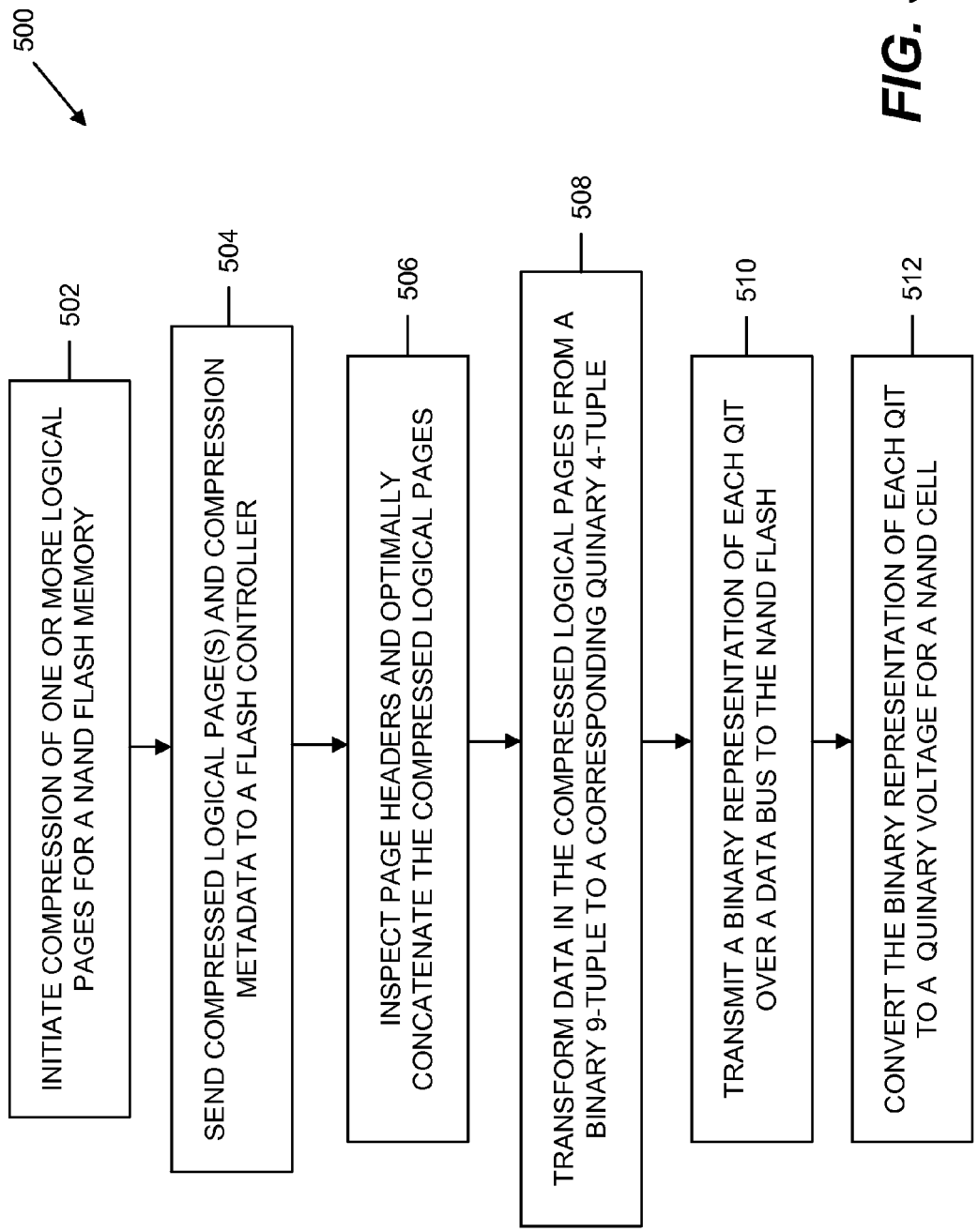
FIG. 5 is a flowchart illustrating an embodiment of a method for writing data to physical NAND pages using a quinary flash cell mapping scheme.
Figure 6:
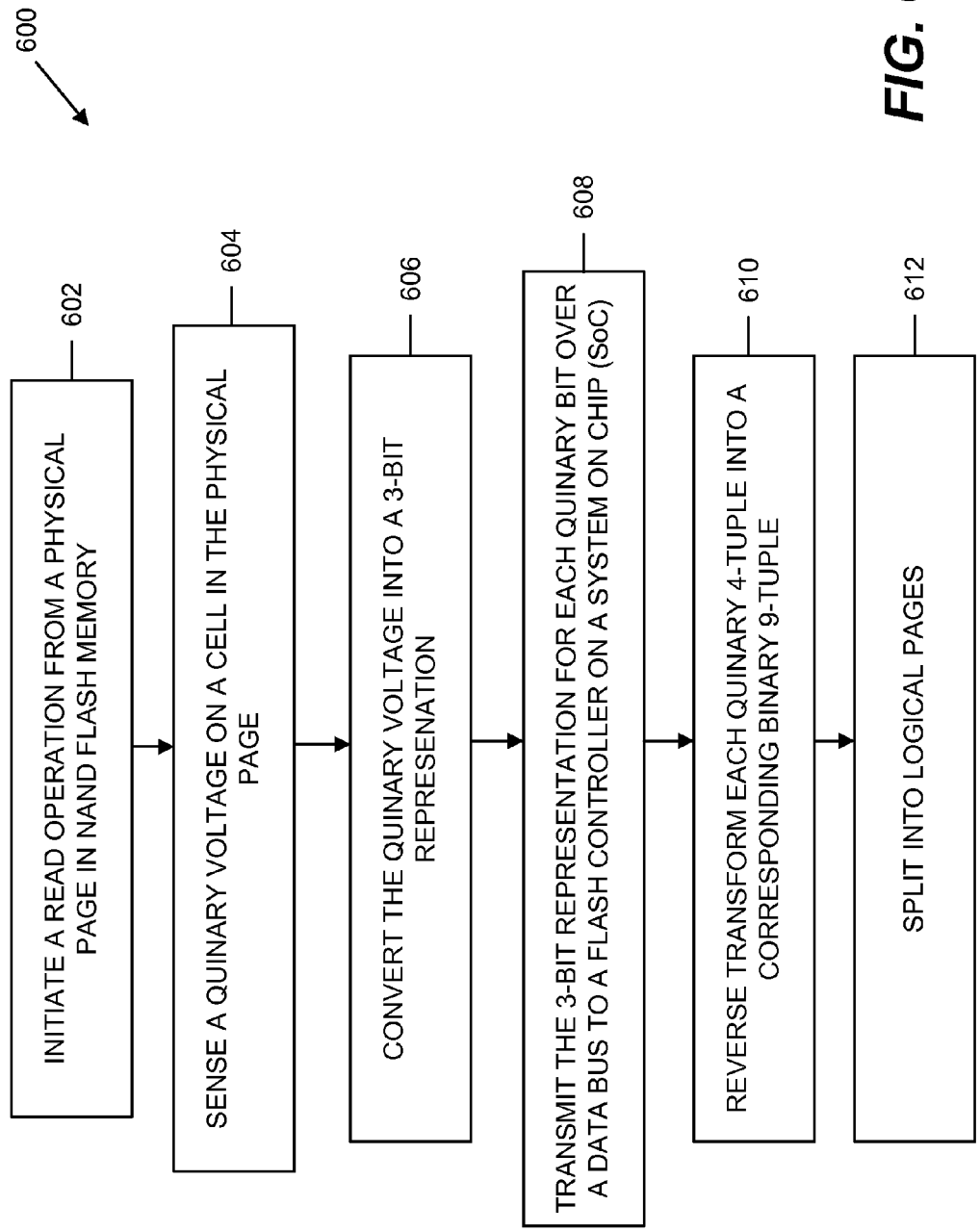
FIG. 6 is a flowchart illustrating an embodiment of a method for reading data from physical NAND pages using a quinary flash cell mapping scheme.

FIG. 5 is a flowchart illustrating an embodiment of a method 500 for writing data to physical pages 124 using a quinary flash cell mapping scheme. At block 502, the data compression component 118 may compress data into two or more logical pages 200, as described above. At block 504, compressed and/or uncompressed logical pages may be sent to the flash controller 108 along with compression metadata. The flash controller 108 inspects the logical page headers and optimally concatenates the compressed logical pages 200 (block 506). During the concatenation step, the last pointer metadata which describes the placement and organization of multiple compressed pages within a physical page may be produced and inserted into every compressed page header. At block 508, the flash controller 108 may transform the data in each logical page 200 from a binary 9-tuple 300 to a corresponding quinary 4-tuple. It should be appreciated that the flash controller 108 may perform various alternative non-power-two transformations on the binary bits as mentioned above, including base-6, base-7, base-9, etc. At block 510, the flash controller 108 transmits the binary representation of each quinary bit over a data bus FIG. 6 is a flowchart illustrating an embodiment of a method for reading data from physical pages 124. In response to a read operation being initiated (block 602), the quinary voltage on cells in a physical page 124 may be sensed (block 604). At block 606, the quinary voltages may be converted into the corresponding 3-bit representation via A/D converter 132. At block 608, the controller 130 in the NAND flash 104 may transmit the 3-bit representation for each quinary bit over the data bus 150 to the flash controller 108. At block 610, the transformation module 142 may perform a reverse transformation in which each quinary 4-tuple is transformed into the corresponding binary 9-tuple 300. At block 612, the concatenate module 146 may split the resulting data into the original logical pages 200.

As mentioned above, the quinary flash cell mapping provided by the system 100 increases the capacity of the NAND flash 104 relative to conventional 4-level MLC without the voltage margin problems encountered in existing 8-level implementations. FIGS. 7-13 illustrate alternative embodiments for enabling error detection and/or correction schemes to leverage the increased capacity provided by quinary flash cell mapping. It should be appreciated that the error detection and/or correction schemes described below in connection with FIGS. 7-13 may be provided with or without the data compression techniques described above.

Figure 7:
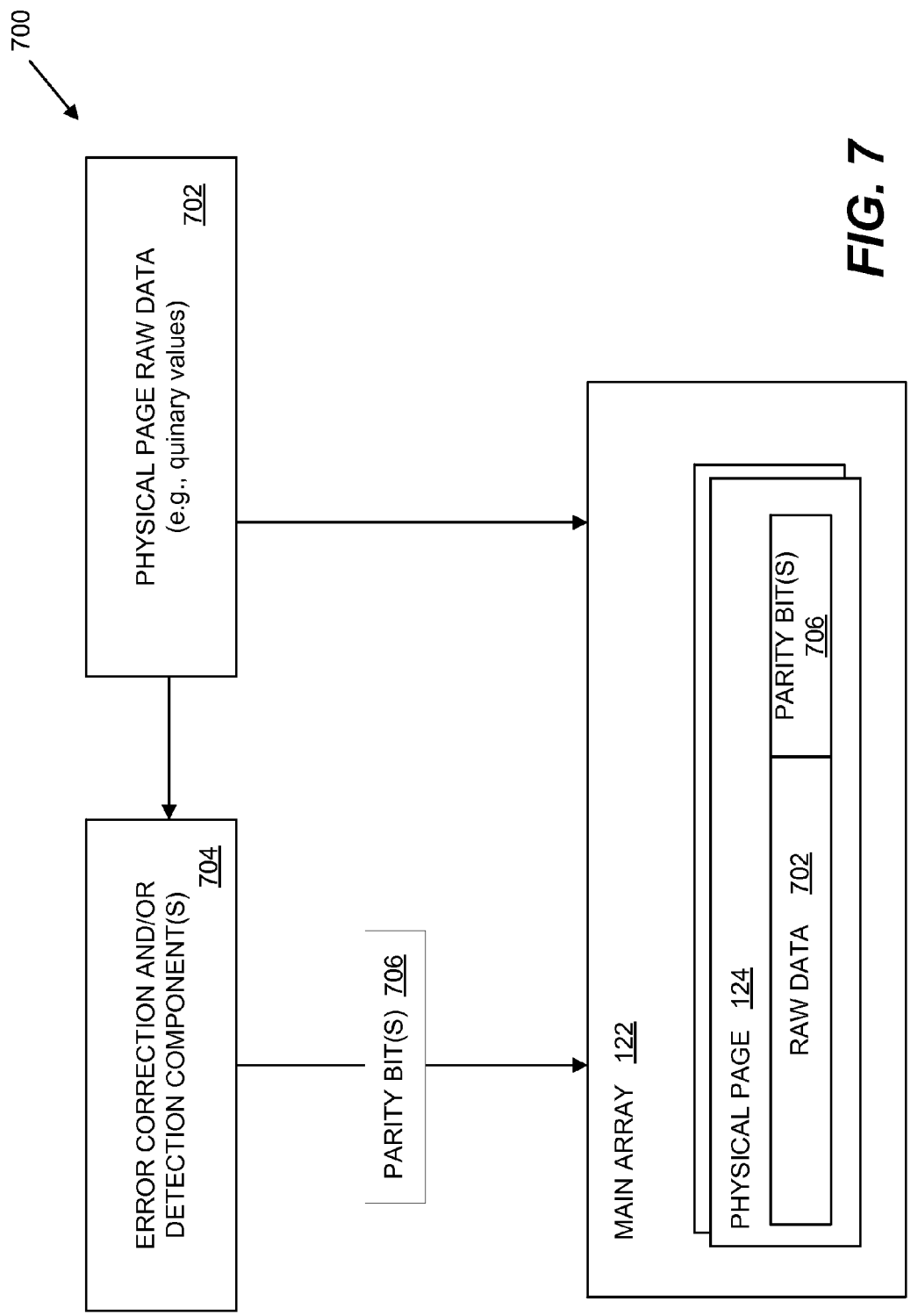
FIG. 7 is block/flow diagram illustrating an embodiment of a method for incorporating quinary flash cell mapping with error detection and/or correction.

FIG. 7 is block/flow diagram generally illustrating a method 700 for incorporating quinary flash cell mapping with error detection and/or correction. As illustrated in FIG. 7, raw data 702 for a physical page 124 may be provided as input to error correction and/or detection component(s) 704. The raw page data 702 comprises the quinary representation of the binary data generated in the manner described above. The error correction and/or detection component(s) 704 generate one or more parity bit(s) 706 for the raw page data 702. Because of the increased capacity yielded from the quinary flash cell mapping, the parity bit(s) 706 may be stored in the corresponding physical page 124 along with the raw page data 702 rather than storing them in a spare array 128 as is the case with conventional error correction and detection techniques.

Figure 8:
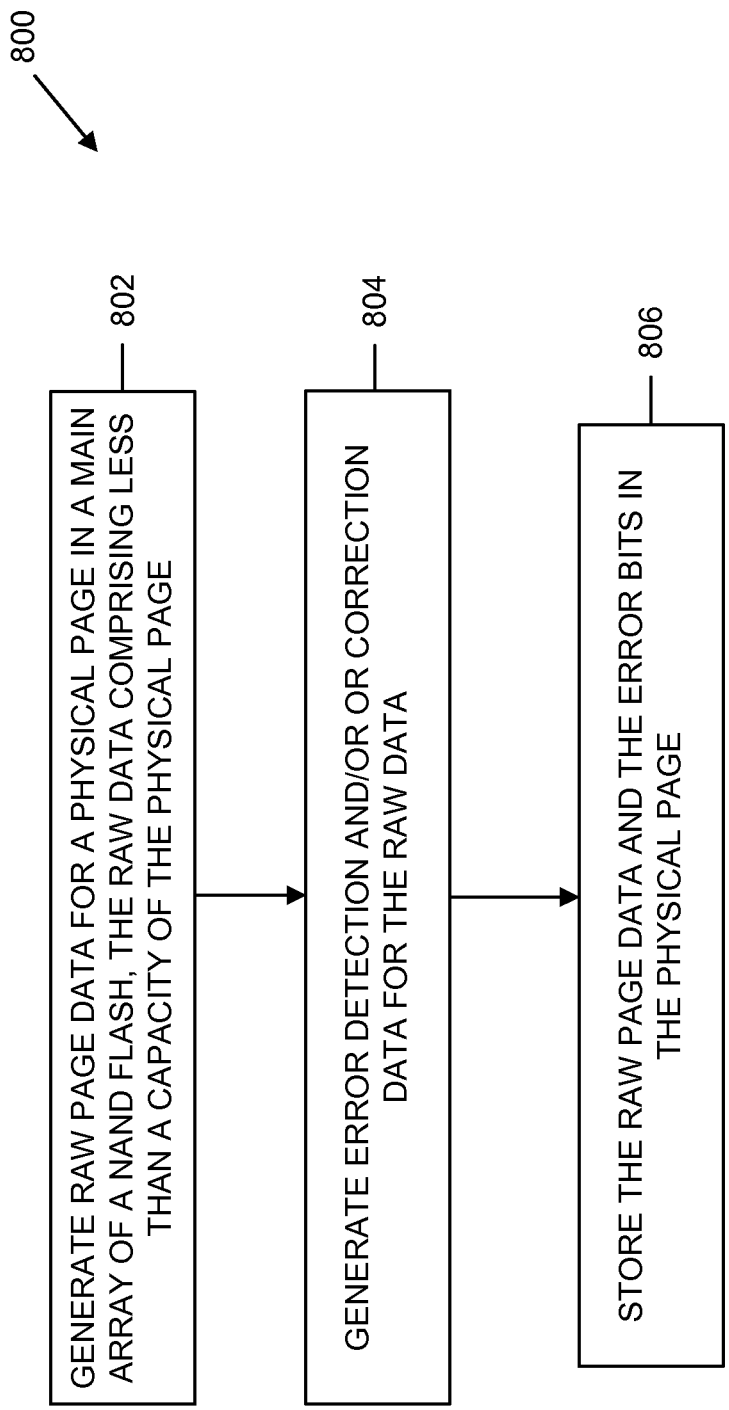
FIG. 8 is a flowchart illustrating another embodiment of a method for incorporating quinary flash cell mapping with error detection and/or correction.

FIG. 8 is a flowchart illustrating an embodiment of a method 800 for incorporating quinary flash cell mapping with error detection and/or correction. At block 800, the flash controller 108 may generate the raw page data 702 for a physical page 124 in the main array 122. The raw page data 702 may be generated in accordance with the quinary flash cell mapping described above in connection with FIGS. 1-6. The raw page data 702 may comprise less than a capacity of the physical page 124 due to the use of non-power-of-two flash cell mapping, which increases the capacity of the NAND flash 104. For example, two 4 Kbyte logical pages 200 may be mapped to less than the full capacity of a 4 Kbyte physical page 124. The increased capacity gained via the quinary flash cell mapping may enable the parity bit(s) 706 generated by the error detection and/or correction component(s) 704 (block 802) to be combined in the same physical page 124 as the raw page data 702 (block 806) without the need for storing it in an associated spare array 128.

It should be appreciated that the error correction and/or detection component(s) 704 may support any desirable schemes for adding redundancy to the raw page data 702 for the purpose of checking the consistency of the data stored in the physical pages 124 and/or recovering data determined to be corrupted. The error detection and/or correction schemes may be systematic or non-systematic. In a systematic scheme, the flash controller 108 may send the original data and append a fixed number of check bits (or parity data), forming a codeword, which are derived by multiplying the data bits by the codeword generator matrix. Upon reading back the codeword, a syndrome is calculated by taking the product of the codeword (which may have errors in it) and the parity check matrix. If the syndrome contains non-zero elements, an error has occurred at some point during the storage of data, and the position of the non-zero elements within the syndrome can be used to identify and correct the errors. If the system 100 uses a non-systematic code, the codewords are generated using a different generator matrix, resulting in a codeword that is not a simple concatenation of the original data and the parity check bits. However, it should be appreciated that functionally they may be processed similarly using the generator matrix to create the codeword and using the parity check matrix to correct any errors. The error detection and/or correction schemes may be binary or non-binary. In a binary scheme, the original data, generator matrix and parity check matrix may operate using binary values. In a non-binary scheme, the original data may be converted into symbols and the generator matrix and parity check matrix operations may use higher order field arithmetic based on the symbol size. For example, a binary scheme may use order 2 arithmetic whereas non-binary schemes may use higher order (e.g., order 3, 4, 5, or greater). The error detection/or correction schemes may further be unshortened, shortened, lengthened, augmented, or punctured, referring to the use of codewords that may be shortened or lengthened for the purpose of fitting into the space available without significantly compromising error correction performance. The error detection/or correction schemes may be multi-staged or concatenated, where two or more independent error correction schemes are successively applied to the data.

It should be further appreciated that various types and categories of error correction and/or detection techniques may be implemented in the system 700. In an embodiment, the error correction and/detection component(s) 704 may comprise block codes (e.g., linear codes, system codes, or non-systematic codes, as described above) or convolutional codes (e.g., Viterbi, Reed-Solomon, Tornado, etc.). In further embodiments, error correcting codes may comprise any of the following, or other codes: Bose-Chaudhuri-Hocquenghem codes, cyclical codes, Hamming codes, Reddy codes, finite field-based codes, etc. It should be further appreciated that codes may be concatenated forming an inner and an outer code. Inner and outer convolutional codes may be concatenated, as well as inner and outer block codes (e.g., Hamming code using varying parameterization). Concatenating such codes may form an inner ECC and an outer ECC. One of ordinary skill in the art will appreciate that concatenating different forms of codes and/or parameterizations of like codes together may improve ECC performance for various system implementations.

Figure 9:
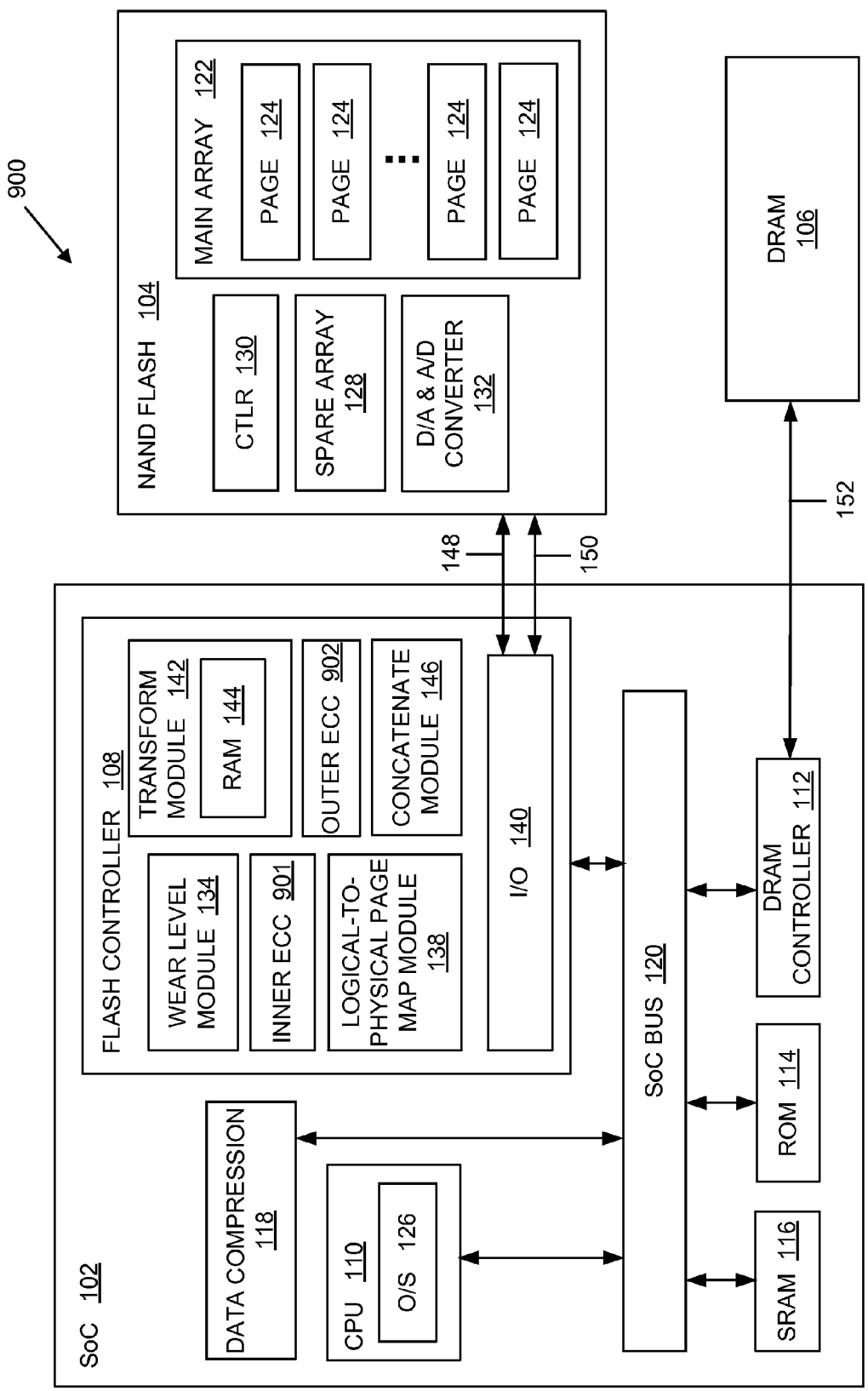
FIG. 9 is a block diagram illustrating an embodiment of a system for concatenating error correction codes using quinary flash cell mapping.

FIG. 9 illustrates an embodiment of a system 900 for concatenating inner and outer error correction codes (ECC) using quinary flash cell mapping. The system 900 is generally configured in the same manner as the system of FIG. 1. The error correction and/or detection component(s) 704 (FIG. 7) may comprise an error correction code (ECC) module configured to detect and/or correct multiple-bit errors during flash memory operations. For example, during a write operation to the NAND flash 104, the ECC module may use the write data as input and then generate redundant parity check bits. The combined write data and parity check bits together form a unit known as a codeword and may be stored either separated (in spare array 128) or together in the main array 122. During a read operation, the ECC module may use the retrieved data portion of the codeword to recompute the parity check bits and then compare these against the parity check bits portion of the codeword that was stored during the write operation. A mismatch between the read recomputed parity and the stored parity indicates a detected error. In addition, a syndrome may be computed which can locate and correct multiple-bit errors within the codeword.

Figure 10:
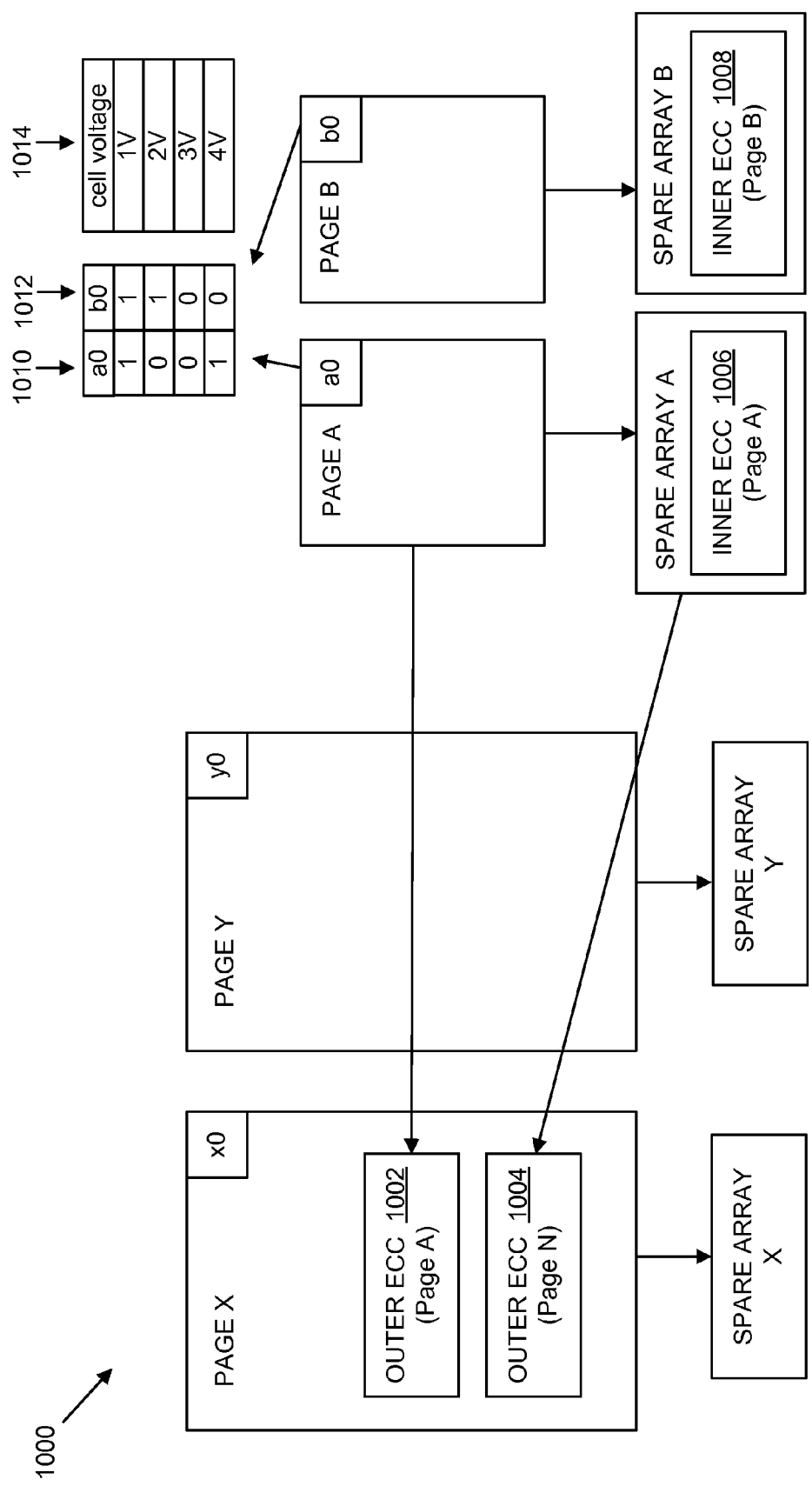
FIG. 10 illustrates operation of the system of FIG. 9 in a "base 2" mode.

As further illustrated in FIG. 9, the ECC module may comprise an inner ECC module 901 and an outer ECC module 902. The flash controller 108 may be configured to selectively control concatenation of the inner ECC and the outer ECC according to various modes. FIG. 10 illustrates operation of the system 900 in a "base 2" mode that does not employ quinary flash cell mapping. In the example of FIG. 10, Page A and Page B comprise the raw data that is stored in the main array 122. For each page, an inner code is generated by inner ECC module 901, which is stored into the respective spare array for that page. Inner ECC 1006 for Page A is stored in spare array A, and inner ECC 1008 is stored in spare array B. In other words, spare array A is paired with Page A and spare array B is paired with Page B. Conventional MLC cell mapping is employed for both the main array 122 and the spare arrays 128.

An outer ECC is generated by outer ECC module 902. Because there is no free space in Page A, Page B, spare array A, or spare array B, the outer ECC parity bits for Page A (i.e., outer ECC 1002) are stored in a Page X. Outer ECC 1002 may only use a portion of the space in the Page X and, therefore, the outer ECC 1004 for other pages, such as a Page N, may be consolidated in Page X. In total, there may be multiple pages for storing the outer ECCs. The outer ECC pages, such as Page X, also have an inner ECC (not shown) that is stored in a spare array X (not shown). The flash cell voltages for binary bits a0 and b0 in Page A and Page B, respectively, are shown in columns 1010, 1012, and 1014. In the "base 2" mode illustrated in FIG. 10, the outer ECC is stored in a different page than the inner ECC, which may require two reads if an error occurs (first from Page A and then Page X).

Figure 11:
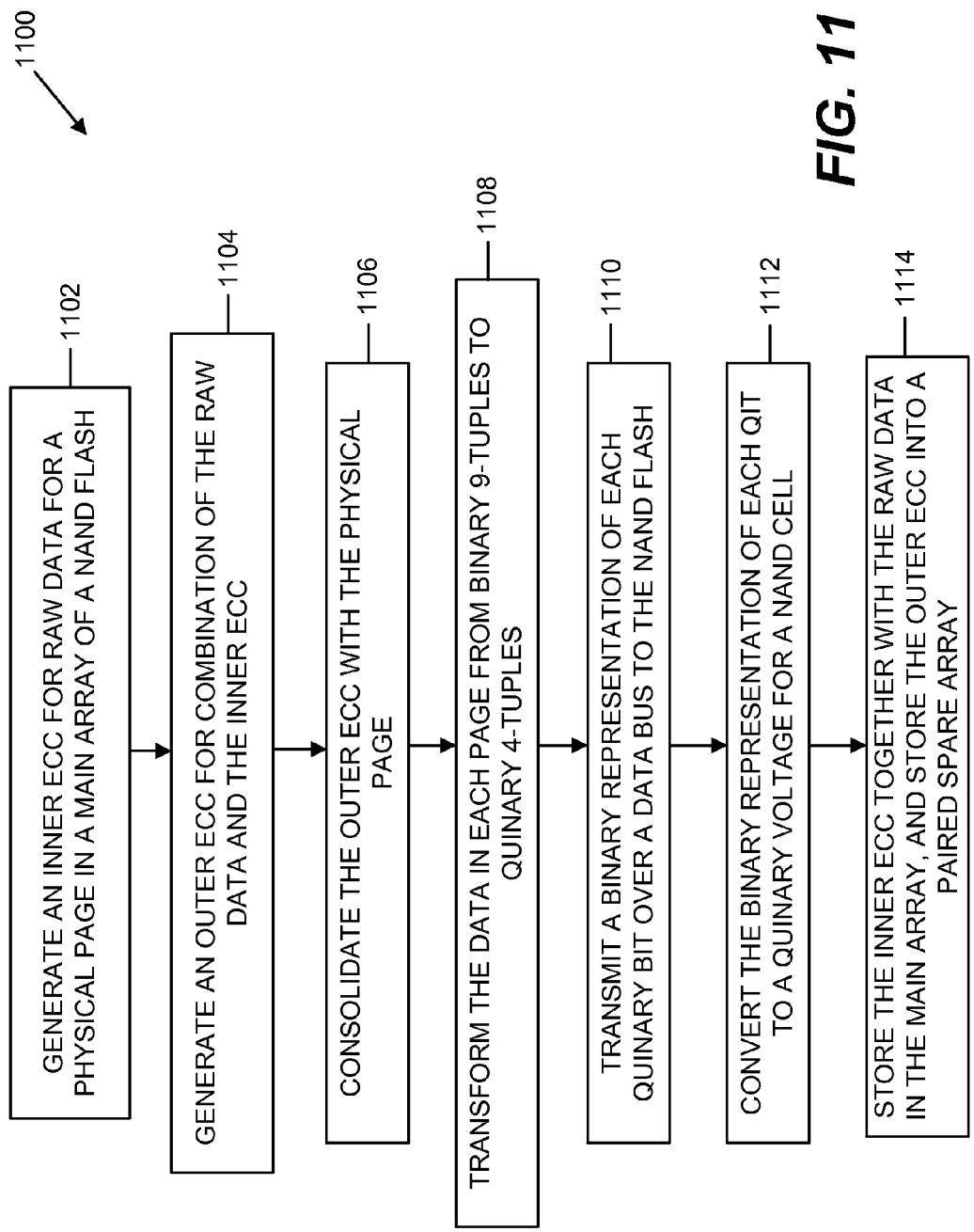
FIG. 11 is a flowchart illustrating an embodiment of a method for concatenating inner and outer error correction codes using quinary flash cell mapping.
Figure 12:
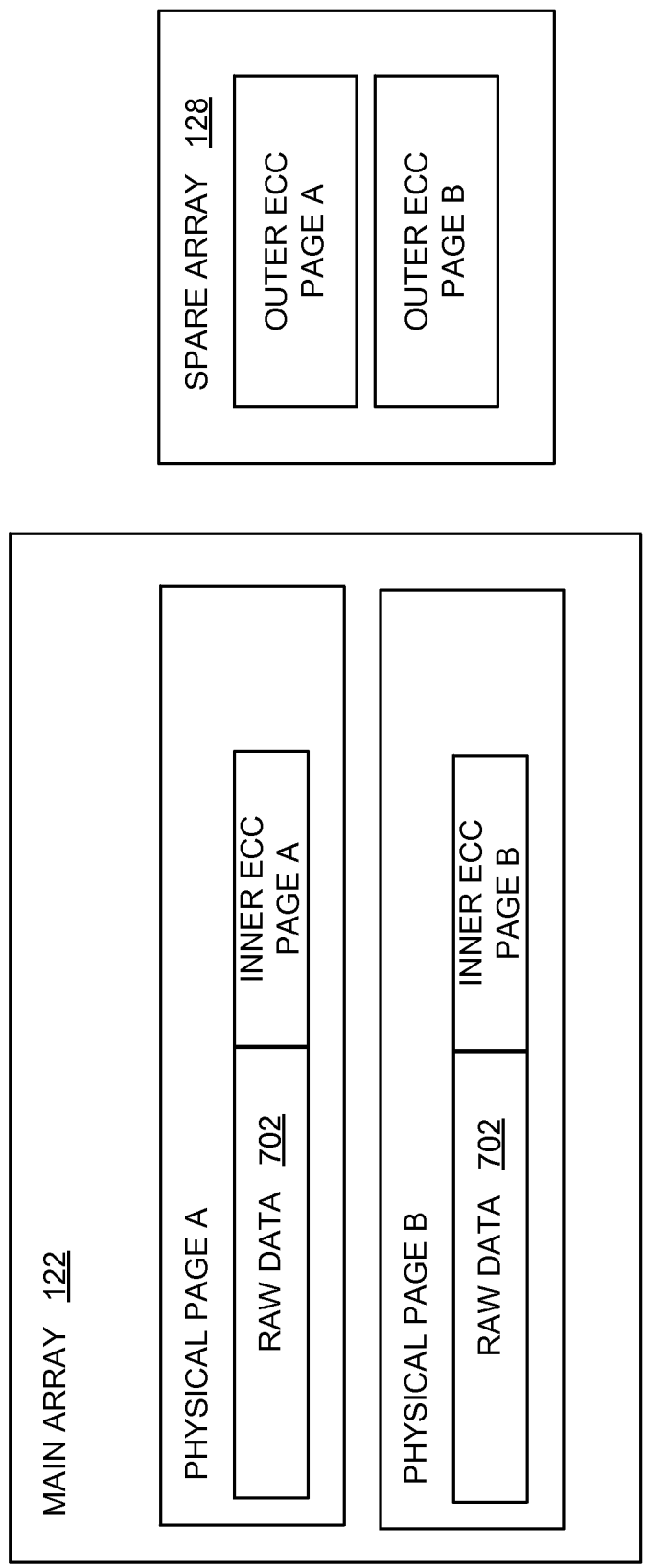
FIG. 12 illustrates an embodiment for storing inner and outer error correction codes in the main array of the NAND flash in FIG. 9.

FIGS. 11-12 illustrate operation of the inner and outer ECC when employing quinary flash cell mapping. FIG. 11 illustrates a write method 1100 for concatenating inner and outer ECC using quinary flash cell mapping. At block 1102, an inner ECC is generated for raw data for a physical page 124 in the main array 122. At block 1104, an outer ECC is generated for a combination of the raw data and the inner ECC. At block 1106, the concatenate module 146 may consolidate the outer ECC parity bits along with the corresponding pages. The inner ECC will be stored together with the raw data in the main array 122. The outer ECC is stored separately in a paired spare array 128. At block 1108, the data in each page is transformed from binary 9-tuples to quinary 4-tuples, as described above. At block 1110, the flash controller 108 transmits a binary representation of each quinary bit over the data bus 150 to the NAND flash 104. At block 1112, the binary representation of each quinary bit is converted to a quinary voltage for a NAND cell via the D/A converter 132. At block 1114, the controller 130 stores the inner ECC together with the raw data in the main array, and stores the outer ECC into a paired spare array.

It should be appreciated that, with the additional capacity afforded by quinary flash cell mapping, the inner ECC may reside with the raw page data in the main array 122. As illustrated in the example of FIG. 12, this may be performed for two physical pages (Page A and Page B). For example, consider that physical Pages A and B may have a capacity of 4096 bytes. 4096 quinary cells can store 9216 bytes, which comprise two 4096 byte pages of raw data plus two 128 byte inner ECC corresponding with the raw data. The outer ECCs are generated for the contents of the corresponding physical pages, and then stored in the spare array 128. It should be appreciated that 128 spare array quinary cells may store 286 bytes comprising two 128 byte outer ECCs. Alternatively, the spare array 128 may comprise a single monolithic outer ECC that is computed on the combined (i.e., all 9216 bytes) content of the main array 122. In this manner, if an error occurs, only a single read may be needed.

Figure 13:
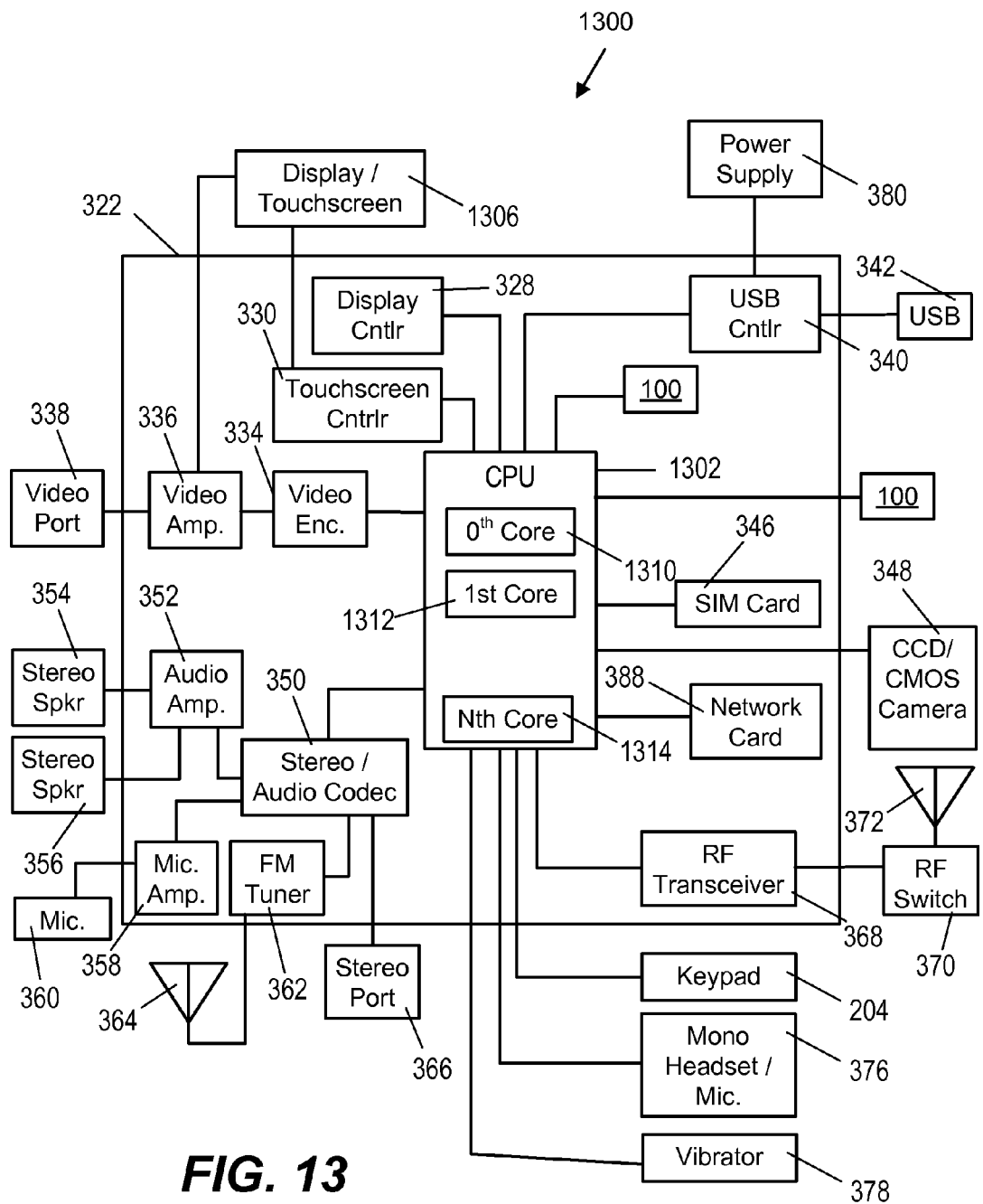
FIG. 13 is a block diagram of an embodiment of a portable communication device for incorporating quinary flash cell mapping.

As mentioned above, the system 100 may be incorporated into any desirable computing system. FIG. 13 illustrates the system 100 incorporated in an exemplary portable computing device (PCD) 1300. It will be readily appreciated that certain components of the system 100 are included on the SoC 322 (FIG. 13) while other components (e.g., the DRAM 106, the NAND flash 104) are external components coupled to the SoC 322. The SoC 322 may include a multicore CPU 1302. The multicore CPU 1302 may include a zeroth core 1310, a first core 1312, and an Nth core 1314. One of the cores may comprise, for example, a graphics processing unit (GPU) with one or more of the others comprising the CPU.

A display controller 328 and a touch screen controller 330 may be coupled to the CPU 1302. In turn, the touch screen display 1406 external to the on-chip system 322 may be coupled to the display controller 328 and the touch screen controller 330.

FIG. 13 further shows that a video encoder 334, e.g., a phase alternating line (PAL) encoder, a sequential color a memoire (SECAM) encoder, or a national television system(s) committee (NTSC) encoder, is coupled to the multicore CPU 1302. Further, a video amplifier 336 is coupled to the video encoder 334 and the touch screen display 1306. Also, a video port 338 is coupled to the video amplifier 336. As shown in FIG. 13, a universal serial bus (USB) controller 340 is coupled to the multicore CPU 1302. Also, a USB port 342 is coupled to the USB controller 340.

Further, as shown in FIG. 13, a digital camera 348 may be coupled to the multicore CPU 1302. In an exemplary aspect, the digital camera 348 is a charge-coupled device (CCD) camera or a complementary metal-oxide semiconductor (CMOS) camera.

As further illustrated in FIG. 13, a stereo audio coder-decoder (CODEC) 350 may be coupled to the multicore CPU 1302. Moreover, an audio amplifier 352 may coupled to the stereo audio CODEC 350. In an exemplary aspect, a first stereo speaker 354 and a second stereo speaker 356 are coupled to the audio amplifier 352. FIG. 13 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 13 further illustrates that a radio frequency (RF) transceiver 368 may be coupled to the multicore CPU 1302. An RF switch 370 may be coupled to the RF transceiver 368 and an RF antenna 372. A keypad 204 may be coupled to the multicore CPU 1302. Also, a mono headset with a microphone 376 may be coupled to the multicore CPU 1302. Further, a vibrator device 378 may be coupled to the multicore CPU 1302.

FIG. 13 also shows that a power supply 380 may be coupled to the on-chip system 322. In a particular aspect, the power supply 380 is a direct current (DC) power supply that provides power to the various components of the PCD 1300 that require power. Further, in a particular aspect, the power supply is a rechargeable DC battery or a DC power supply that is derived from an alternating current (AC) to DC transformer that is connected to an AC power source.

FIG. 13 further indicates that the PCD 1300 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 13, the touch screen display 1306, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for providing compressed data storage using non-power-of-two flash cell mapping, the method comprising:
  receiving one or more compressed logical pages to be stored in a NAND flash memory;
  transforming binary data in the one or more logical pages to a quinary representation, the quinary representation comprising a plurality of quinary bits;
  transmitting a binary representation of each of the plurality of quinary bits to the NAND flash memory; and
  converting the binary representation of each of the plurality of quinary bits to a quinary voltage for a corresponding cell in a physical page in the NAND flash memory.

2. The method of claim 1, wherein the transforming the binary data to the quinary representation comprises: transforming a 9-tuple of binary bits to a 4-tuple of quinary bits.

3. The method of claim 1, further comprising: concatenating the compressed logical pages before transforming the binary data to the quinary representation.

4. The method of claim 1, the converting the binary representation of each of the plurality of quinary bits to the quinary voltage is performed by an analog-to-digital converter in the NAND flash memory.

5. The method of claim 1, wherein the receiving one or more compressed logical pages further comprises determining compression metadata in one or more page headers.

6. The method of claim 1, further comprising:
  initiating a read operation associated with the physical page in the NAND flash memory;
  converting the quinary voltages for each of the plurality of quinary bits to the corresponding binary representation;
  transmitting the binary representation of each of the plurality of quinary bits to a controller; and
  reverse transforming the quinary representation to the binary data for the one or more logical pages.

7. The method of claim 6, wherein the converting the quinary voltages to the corresponding binary representation is performed by a digital-to-analog converter in the NAND flash memory.

8. A system for providing compressed data storage using non-power-of-two flash cell mapping, the method comprising:
  means for receiving one or more compressed logical pages to be stored in a NAND flash memory;
  means for transforming binary data in the one or more logical pages to a quinary representation, the quinary representation comprising a plurality of quinary bits;
  means for transmitting a binary representation of each of the plurality of quinary bits to the NAND flash memory; and
  means for converting the binary representation of each of the plurality of quinary bits to a quinary voltage for a corresponding cell in a physical page in the NAND flash memory.

9. The system of claim 8, wherein the means for transforming the binary data to the quinary representation comprises: means for transforming a 9-tuple of binary bits to a 4-tuple of quinary bits.

10. The system of claim 8, further comprising: means for concatenating the compressed logical pages before transforming the binary data to the quinary representation.

11. The system of claim 8, the means for converting the binary representation of each of the plurality of quinary bits to the quinary voltage comprises an analog-to-digital converter in the NAND flash memory.

12. The system of claim 8, wherein the means for receiving one or more compressed logical pages further comprises: means for determining compression metadata in one or more page headers.

13. The system of claim 8, further comprising:
  means for initiating a read operation associated with the physical page in the NAND flash memory;
  means for converting the quinary voltages for each of the plurality of quinary bits to the corresponding binary representation;
  means for transmitting the binary representation of each of the plurality of quinary bits to a controller; and
  means for reverse transforming the quinary representation to the binary data for the one or more logical pages.

14. The system of claim 13, wherein the means for converting the quinary voltages to the corresponding binary representation comprises a digital-to-analog converter in the NAND flash memory.

15. A computer program embodied in a non-transitory memory and executable by a processor for providing compressed data storage using non-power-of-two flash cell mapping, the computer program comprising logic configured to:
  receive one or more compressed logical pages to be stored in a NAND flash memory;
  transform binary data in the one or more logical pages to a quinary representation, the quinary representation comprising a plurality of quinary bits;
  transmit a binary representation of each of the plurality of quinary bits to the NAND flash memory; and
  convert the binary representation of each of the plurality of quinary bits to a quinary voltage for a corresponding cell in a physical page in the NAND flash memory.

16. The computer program of claim 15, wherein the logic configured to transform the binary data to the quinary representation comprises: logic configured to transform a 9-tuple of binary bits to a 4-tuple of quinary bits.

17. The computer program of claim 15, further comprising: logic configured to concatenate the compressed logical pages before transforming the binary data to the quinary representation.

18. The computer program of claim 15, wherein the logic configured to convert the binary representation of each of the plurality of quinary bits to the quinary voltage comprises an analog-to-digital converter.

19. The computer program of claim 15, wherein the logic configured to receive one or more compressed logical pages further comprises logic configured to determine compression metadata in one or more page headers.

20. The computer program of claim 15, further comprising logic configured to:
  initiate a read operation associated with the physical page in the NAND flash memory;
  convert the quinary voltages for each of the plurality of quinary bits to the corresponding binary representation;
  transmit the binary representation of each of the plurality of quinary bits to a controller; and
  reverse transform the quinary representation to the binary data for the one or more logical pages.

21. The computer program of claim 20, wherein the logic configured to convert the quinary voltages to the corresponding binary representation comprises a digital-to-analog converter in the NAND flash memory.

22. A system for providing compressed data storage using non-power-of-two flash cell mapping, the system comprising:
  a system on chip (SoC) coupled to a flash memory device; and
  a flash controller residing on the SoC configured to:
    receive one or more compressed logical pages to be stored in the flash memory device;
    transform binary data in the one or more logical pages to a quinary representation, the quinary representation comprising a plurality of quinary bits;
    transmit a binary representation of each of the plurality of quinary bits to the NAND flash memory;
  wherein the flash memory device is configured to convert the binary representation of each of the plurality of quinary bits to a quinary voltage for a corresponding cell in a physical page in the flash memory device.

23. The system of claim 22, wherein the flash memory device comprises NAND flash memory.

24. The system of claim 22, wherein the transforming the binary data to the quinary representation comprises: transforming a 9-tuple of binary bits to a 4-tuple of quinary bits.

25. The system of claim 22, wherein the flash controller is further configured to:
  concatenate the compressed logical pages before transforming the binary data to the quinary representation.

26. The system of claim 22, wherein flash memory device comprises an analog-to-digital converter for converting the binary representation of each of the plurality of quinary bits to the quinary voltage.

27. The system of claim 22, wherein the receiving one or more compressed logical pages further comprises determining compression metadata in one or more page headers.

28. The system of claim 22, wherein the flash memory device is further configured to, in response to a read operation associated with the physical page:
  convert the quinary voltages for each of the plurality of quinary bits to the corresponding binary representation; and
  transmit the binary representation of each of the plurality of quinary bits to the flash controller.

29. The system of claim 28, wherein the flash controller is further configured to reverse transform the quinary representation to the binary data for the one or more logical pages.

30. The system of claim 22, wherein the SoC and the flash memory device are incorporated in a portable communication device comprising one of a smartphone, a tablet computer, and a portable gaming device.

* * * * *